United States Patent
Tan et al.

(10) Patent No.: US 7,445,874 B2
(45) Date of Patent: Nov. 4, 2008

(54) METHOD TO RESOLVE LINE END DISTORTION FOR ALTERNATING PHASE SHIFT MASK

(75) Inventors: Sia Kim Tan, Singapore (SG); Qunying Lin, Singapore (SG); Liang-Choo Hsia, Singapore (SG)

(73) Assignee: Chartered Semiconductor Manufacturing, Ltd, Singapore (SG)

( * ) Notice: Subject to any disclaimer, the term of this patent is extended or adjusted under 35 U.S.C. 154(b) by 758 days.

(21) Appl. No.: 10/985,263

(22) Filed: Nov. 10, 2004

(65) Prior Publication Data

US 2006/0099518 A1    May 11, 2006

(51) Int. Cl.
G03F 9/00 (2006.01)
G06F 17/50 (2006.01)

(52) U.S. Cl. ............... 430/5; 716/19; 716/20; 716/21

(58) Field of Classification Search .......... 430/5; 716/19, 20, 21
See application file for complete search history.

(56) References Cited

U.S. PATENT DOCUMENTS

| | | | |
|---|---|---|---|
| 6,214,494 B1 | 4/2001 | Bula et al. | |
| 6,470,489 B1 | 10/2002 | Chang et al. | |
| 6,553,560 B2 | 4/2003 | Ma | |
| 6,623,895 B2 | 9/2003 | Chen | |
| 6,664,009 B2 | 12/2003 | Lin | |
| 6,706,452 B2 * | 3/2004 | Hayano et al. | 430/5 |
| 6,711,732 B1 | 3/2004 | Dai | |

* cited by examiner

Primary Examiner—Mark F. Huff
Assistant Examiner—Jonathan Jelsma
(74) Attorney, Agent, or Firm—Horizon IP Pte Ltd

(57) ABSTRACT

A embodiment method for forming a layout for a phase shift mask. A embodiment comprises providing a layout comprising a first feature, a first shifter region and a second shifter region. The first feature preferably has a L-shape portion with an elbow region. The first shifter region is on the outside of the L-shaped portion and the second shifter region is on the inside of the L-shaped portion. The elbow region has an outside corner away from the second shifter region. We identify a phase conflict region caused by the L-shaped portion of the first feature, the first shifter region and the second shifter region. We resolve the phase conflict by modifying the elbow region by moving the outside corner of the elbow region away from the first shifter region and the phase conflict region. The modification of the elbow region further comprises forming a jog region in the line end section of the first feature.

35 Claims, 17 Drawing Sheets

METHOD TO RESOLVE LINE END DISTORTION FOR ALTERNATING PHASE SHIFT MASK

BACKGROUND OF INVENTION

1) Field of the Invention

This invention relates to the field of semiconductor devices. More particularly, the invention relates to a method and apparatus for allowing phase conflicts between phase shifting regions in a phase shifting mask to be used in optical lithography processes for manufacturing integrated circuit devices.

2) Description of the Prior Art

Semiconductor devices continue to be produced at reduced sizes as optical lithography processes have evolved. Techniques such as phase shifting have been developed to assist in the production of subwavelength features on the integrated circuits (IC) using optical lithography processes. Subwavelength features are features that are smaller than the wavelength of light used to create circuit patterns in the silicon. More generally, phase shifting can be used to create features smaller than a minimum realizable dimension for the given process.

Through the use of phase shifting masks, such subwavelength features can be efficiently produced. (Note, that the term "mask" as used in this specification is meant to include the term "reticle.") One approach to producing a phase shifting mask (PSM) is to use destructive light interference caused by placing two, out of phase, light transmissive areas in close proximity in order to create an unexposed region on a photoresist layer of an IC. If that unexposed area is then protected from exposure when a binary mask is used to expose the remaining field (thus causing definition of the remaining structure), the resultant IC will include subwavelength features created by the PSM.

One approach to preparing an IC for production using PSMs is for one or more features of the IC to be identified for production using PSMs. For example, a designer might identify one or more particular features for production using the PSM, e.g. to define the identified lines (gates or other features) at subwavelength sizes.

Methods to design phase shift masks need to be improve to better define smaller features such as line ends.

Relevant technical developments in the literature can be gleaned by considering the following. U.S. Pat. No. 6,664, 009 (Liu) shows an alternating phase shift mask process.

U.S. Pat. No. 6,553,560—Ma, et al.—Alleviating line end shortening in transistor endcaps by extending phase shifters.

U.S. Pat. No. 6,711,732—Dai, et al.—Full sized scattering bar alt-PSM technique for IC manufacturing in sub-resolution era.

U.S. Pat. No. 6,623,895—Chen, et al. shows a Hybrid phase-shift mask.

U.S. Pat. No. 6,214,494 B1—Bula et al.—shows a method to add serifs to line ends.

U.S. Pat. No. 6,470,489 B1 (Chang et al. ) shows an OPC method.

SUMMARY OF THE INVENTION

The example embodiments of the present invention provide a method for designing a phase shift mask, a phase shift mask, and a computer method for designing a phase shift mask.

An example embodiment for forming a layout for a phase shift mask, the method comprises the following.

providing a layout comprising a first feature, a first shifter region and a second shifter region; the first feature has a elbow region identifying a phase conflict region caused by the first feature, the first shifter region and the second shifter region; and resolving the phase conflict region by modifying the elbow region by moving the elbow region away from the first shifter region and the phase conflict region thereby creating a layout for a phase shift mask.

Another example embodiment is for forming a layout for a phase shift mask. The method comprises the following.

providing a layout comprised of a line end section, a first shifter region and a second shifter region; the first and the second shifter regions meet at phase edge at about a right angle to the length of the line end section;

adding a phase separation region to the line end section to form a first feature; the phase separation region separates the first shifter region and the second shifter region;

the first feature has an elbow region; the first shifter region is on the outside of first feature and the second shifter region is on the inside of the first feature;

the elbow region having an outside corner away from the second shifter region;

identifying a phase conflict region caused by the first feature, the first shifter region and the second shifter region; and resolving the phase conflict region by modifying the elbow region by moving the elbow region away from the first shifter region and the phase conflict region thereby creating a layout for a phase shift mask.

Another example embodiment is a computer program for producing a layout for a phase shift mask. The program comprises the following.

a first set of computer instructions for providing a layout comprising a first feature, a first shifter region and a second shifter region; the first feature has a elbow region;

a second set of computer instructions for identifying a phase conflict region caused by the first feature, the first shifter region and the second shifter region; and a third set of computer instructions for resolving the phase conflict region by modifying the elbow region by moving the elbow region away from the first shifter region and the phase conflict region thereby creating a layout for a phase shift mask.

Another example embodiment is a phase shift mask having a layout having phase areas and opaque regions for defining at least a portion of an integrated circuit layout; the phase areas and opaque regions beginning defined using the following process comprising:

providing a layout comprising a first feature, a first shifter region and a second shifter region; the first feature has a elbow region identifying a phase conflict region caused by the first feature, the first shifter region and the second shifter region; and resolving the phase conflict region by modifying the elbow region by moving the elbow region away from the first shifter region and the phase conflict region thereby creating a layout for a phase shift mask.

The above advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The example features and advantages of a phase shift mask layout and further details of a process of fabricating such a layout in accordance with the embodiments of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The example embodiments of the present invention will be described in detail with reference to the accompanying drawings. The example embodiments provide methods of obtaining a straighter line end that can be achieved for alternating phase shifting mask, for example, at line end, region of double or greater perpendicular line ends.

The example embodiments are preferably implemented on computers and/or networks and/or computer related media.

A. Curved Line Ends in Photoresist using Phase Shift Masks

Figure 1A:
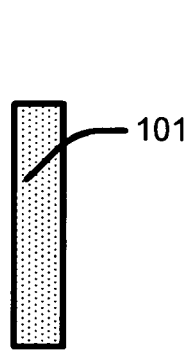
FIGS. 1A through 1F are top down views for illustrating a method for forming a phase shift mask layout according to an example embodiment of the present invention.

FIGS. 1A to 1F shows the "curved line end" problem with a phase shift mask. FIG. 1A shows a design of a line end portion 101.

Figure 1B:
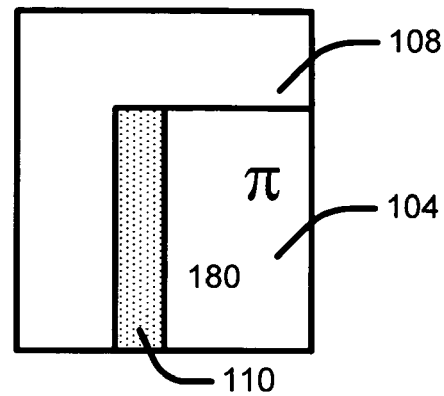

FIG. 1B shows a PSM layout feature 110, 0 and 180 degree shifters 104 108 to define the line end portion in FIG. 1A.

Figure 1C:
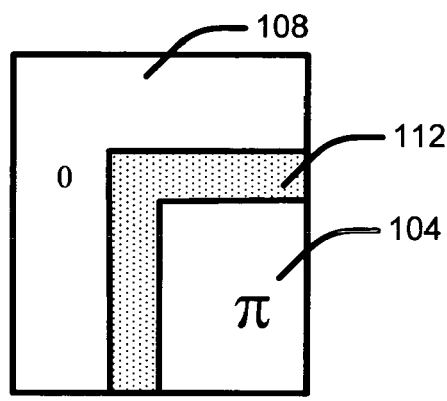

FIG. 1C shows a portion add the feature 112.

Figure 1D:
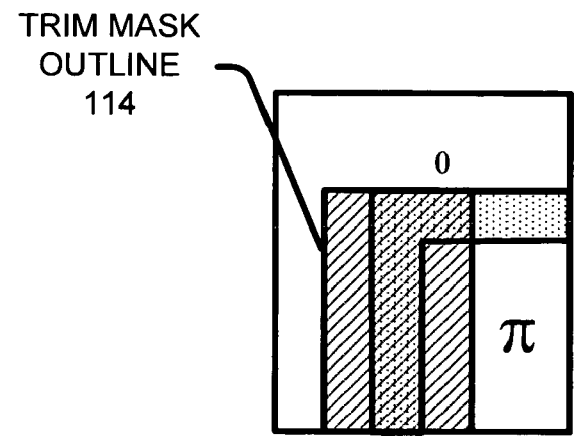

FIG. 1D shows a trim mask 114.

Figure 1E:
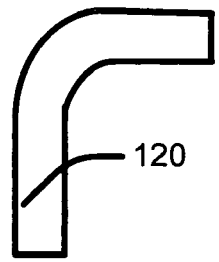

FIG. 1E shows the resultant resist profile 120.

Figure 1F:
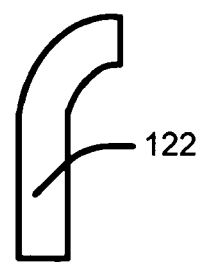

FIG. 1F shows resultant resist profile 120 after the trim mask. The resist profile has an undesirable curve.

Although the phase assignment process of the phase 0 degree and the 180 degree in the alternating phase shifting mask is correctly assigned without phase conflict issues, unintended elbow junction images can still be formed during phase mask exposure as shown in FIGS. 1E and 1F. These images at design pattern line end are formed as a result of phase edge occurrence or strong destructive interference from the different phases. Such elbow junction images will have corner rounding and after trim mask exposure will produce a line with curving line end.

Example Embodiment

FIGS. 2A through 2E illustrate an example method for forming a layout for a phase shift mask and a phase shift mask.

Figure 2A:
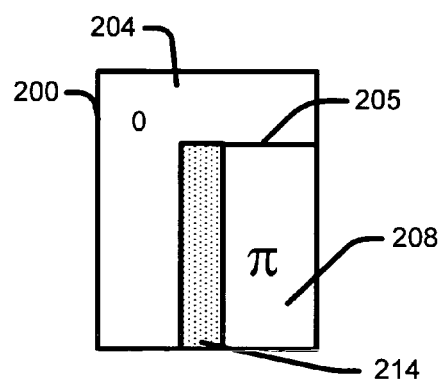
FIGS. 2A through 2E and 2E-1, and 2E-2 top down views for illustrating a method for forming a phase shift mask layout according to an example embodiment of the present invention.

FIG. 2A shows an illustration a layout 200 comprised of a phase shift mask and mask design of a line end section 214, a first shifter region 204 and a second shifter region 208. The line end section 214 is part of a line that extends further off the drawing. For illustration, the first shifter region 204 is shown as a 0 degree shift region and the second shifter region 208 is shown as a 180 degree shift region. The first and second shifter region can be any degree shift.

The first and the second shifter regions 204 208 preferably meet at phase edge 205 at about a right angle to the length of said line end section 214. Destructive interference near the phase edge 205 can create a phase edge occurrence or a region of low intensity and create the end rounding effects in the subsequently exposed and developed photoresist.

Figure 2B:
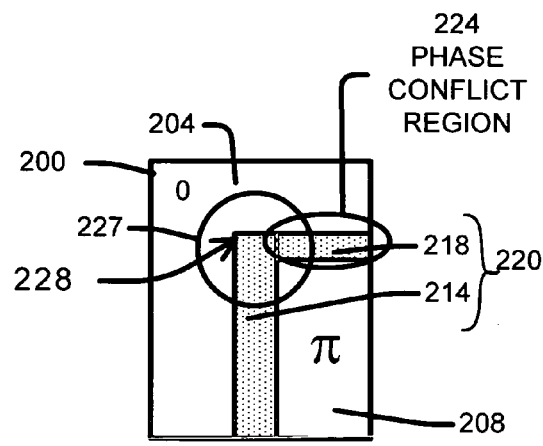

Referring to FIG. 2B, we form the first feature (L shaped feature) 220 (214 218) by adding a phase separation region 218 to a line end section 214 (or initial feature). The phase separation region 218 is formed to further separate the first and second shifter regions 204 208 to reduce phase conflict.

The layout 200 comprises a first feature 220 (214 218), a first shifter region 204 (indicated by 0 in the figures) and a second shifter 208 (indicated by pi (180) in the figures). The first feature has an L-shape portion 218 214 with an elbow region 227. The first shifter region 204 is on the "outside" of the first feature and the second shifter region 208 is on the "inside" of the first feature. The "inside" is on the 90 degree angle side of the intersection of the line end section 214 and the phase separation region 218 as shown in the FIG. 2B. The (intermediate) first feature is now preferably comprised of the line end section 214 and the "phase separation region" 218.

The elbow region has an outside corner 228 away from the second shifter region.

As shown in FIG. 2B, we further identify a phase conflict region 224 caused by the L-shaped portion 214 218 of the first feature 220, the first shifter region 204 and the second shifter region 208. The placement of shifters for defining the first feature generates a phase conflict or phase edge region.

Figure 2D:
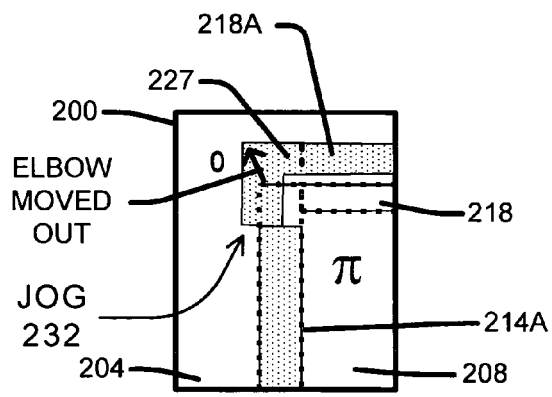
Figure 2C:
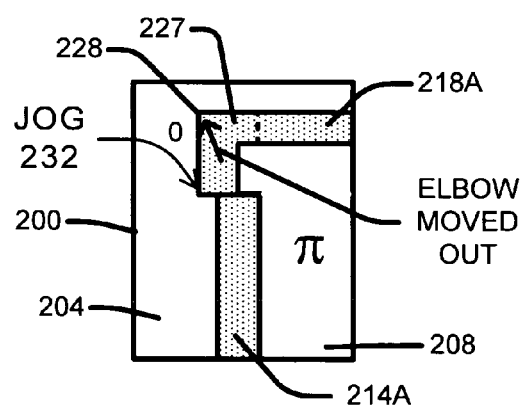

Referring to FIG. 2C, we resolve the phase conflict by modifying the elbow region 227 by moving the outside corner 228 of the elbow region away from the first shifter region 208 and the phase conflict region 224. Preferably the outside corner 228 of the elbow region is moved away in both the x and y directions. The elbow region is the portions of the line end section 214 and phase separation region 218 near the connection of the two regions.

As shown in FIG. 2C, the modification of the elbow region further comprises forming a jog region 232 in the first feature (e.g., second elbow region). The corner region is shifted outward in the x or y or both x and y directions. The "Jog" is created by moving a portion of the line in the same direction as the corner region.

In other embodiments, one or more JOGS can be added as necessary. For example, a jog in the X-direction and a second jog in the Y-direction could be added.

Figure 2E:
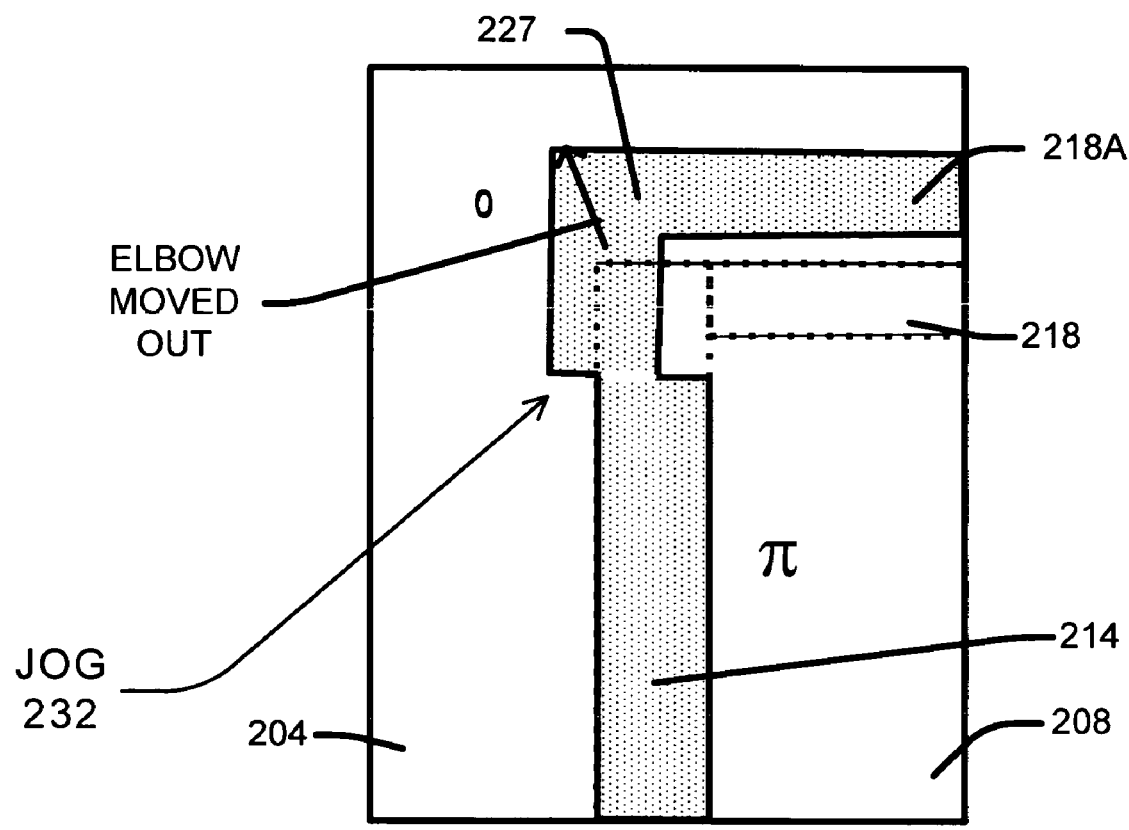
Figures 1, 2E:
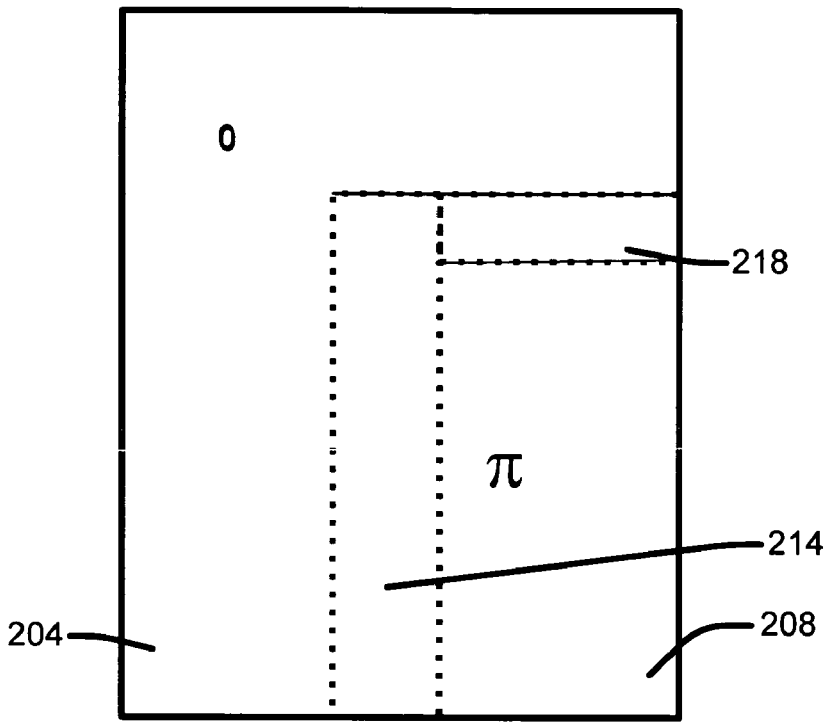
Figures 2, 2E:
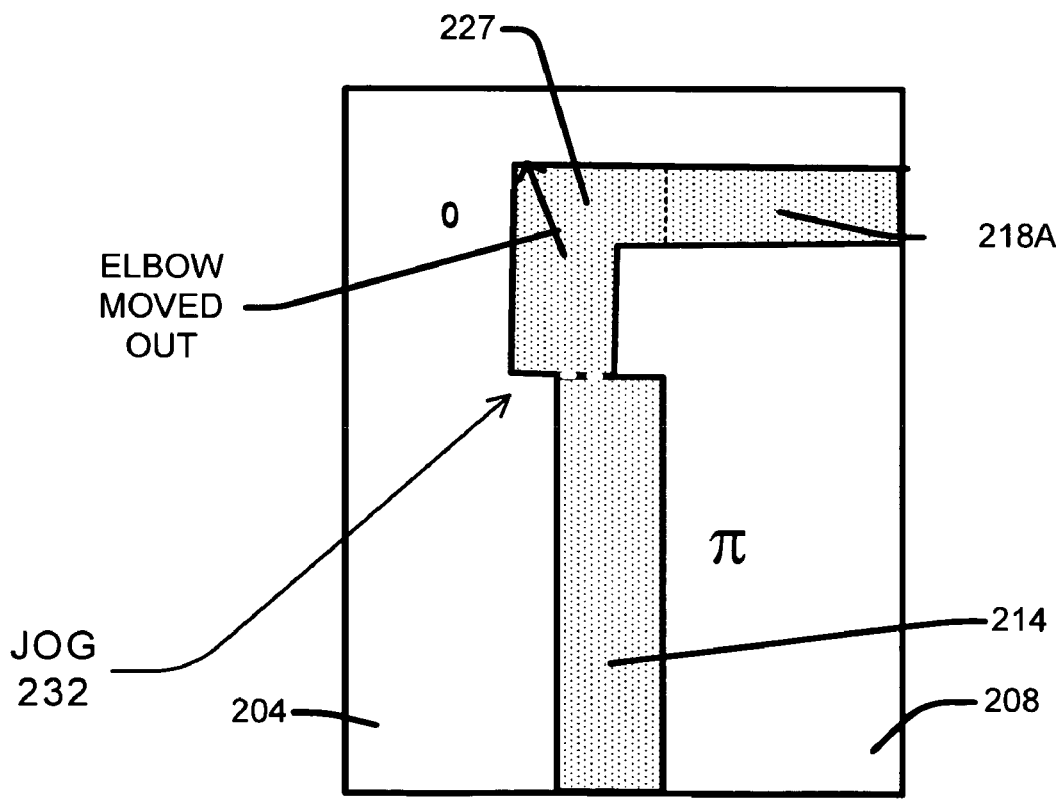

FIG. 2D shows the separator region 218, and original line 214 superposed on the mask layout and improved feature 236 shown in FIG. 2C. FIG. 2E shows a larger scale view of the layout shown in FIG. 2D. FIG. 2E-1 shows to view comparable to the view in FIG. 2B. FIG. 2E-2 shows a final view of the layout or mask.

The first feature preferably has a minimum width that minimizes phase conflicts. In an option, the layout is for a dark field mask and said first feature will be an opaque (e.g., chrome).

Example of a Method

FIGS. 3A to 3H illustrate an example embodiment for a method to layout and design a phase shift mask to reduce line shortening.

Figure 3A:
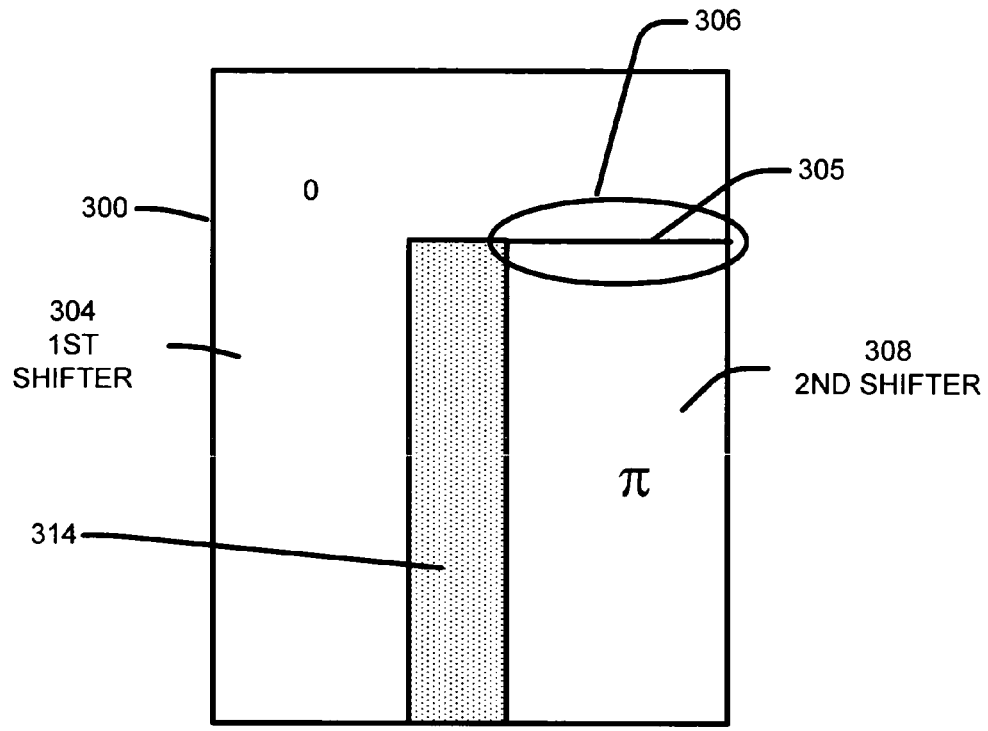
FIGS. 3A through 3I are top down views for illustrating a method for forming a phase shift mask layout according to an example embodiment of the present invention.

FIG. 3A shows a PSM layout 300 with line end section feature 314, 0 and 180 shifters 314 308 to define the line end portion. The phase conflict region 306 is identified. The line end section 314 is preferably part of a line that extends further than shown in the figures. The first shifter 304 and second shifter 308 meet at phase edge 305.

A. Identify Phase Shift Conflict Regions

Figure 3B:
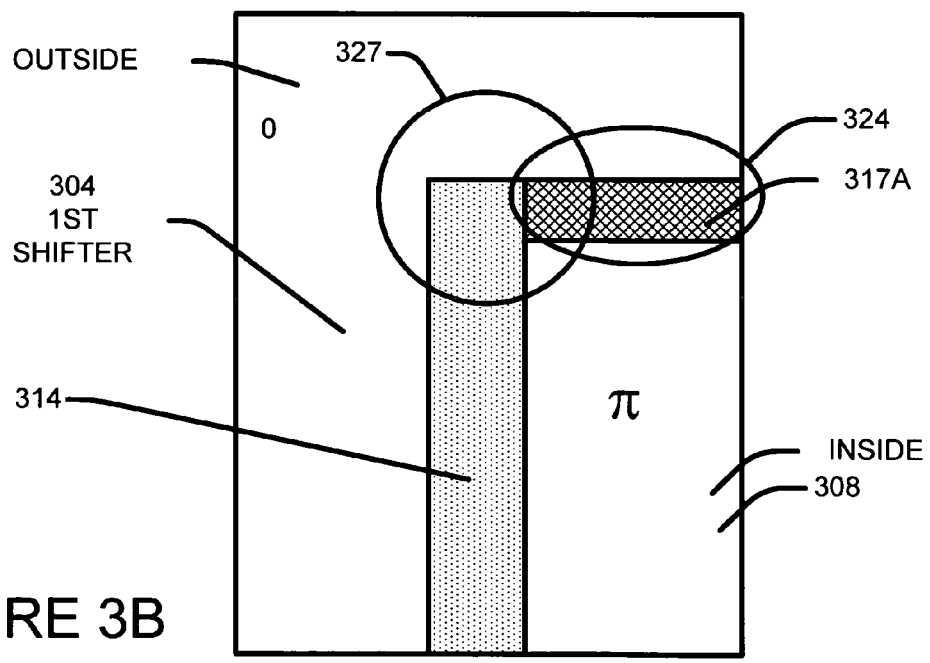

As shown in FIG. 3B (and 3A) we identify a phase conflict region 324 caused by the first feature 320, the first shifter region 304 and the second shifter region 308. The first and said second shifter regions meet at phase edge at about a right angle to the length of said line end section and about at the end of the line end section.

There is a need to identify the phase edge occurrence or region of formation of line low intensity in alternating phase shift mask especially at line ends. An example of a method to identify the phase conflict region is as follows. After the GDSII layout design layer is phase assigned, 3 layers are area generated. They are the 0 deg phase layer, 180 deg phase layer for the phase mask and the trim layer for the trim mask (e.g., a binary or attenuated PSM). When the edges of the 0 deg phase shifting layer and the edge of the 180 deg phase shifting layer are at close proximity, or happen to be the same line, that coincident edges of the two phase layer will produce a region of low intensity from aerial image. The low intensity formation phenomenon can be obtained by calculation or observed using simulation. A preferred current approach is to compute the distance of the phase edges from the GDSII file input.

The minimum width of chrome between the 0 deg phase layer and 180 deg phase layer that will result in the low intensity starts from zero to the minimum resolvable CD (resolution limit), depending on the illumination wavelength and lens numerical aperture. It becomes a problem when the width is less than the resolution limit. This is because the effect of the chrome lines will have little or no contribution to the overall intensity as majority is from the phase edge interference.

B. Generate a First Marker Polygon

Referring to FIG. 3B, in layout 300 we generate a first marker polygon (e.g., phase separation polygon) 317A that separates the first shifter region 304 and the second shifter region 308 in the phase conflict region 324.

Preferably, the first feature and the first marker polygon 314 317A have an L- shape portion with an elbow region 327.

The first shifter region 304 is on the outside of the L-shaped portion and the second shifter region 308 is on the inside of the L-shaped portion.

The phase separation polygon 317A can be use as a marker/guide for the generation of the elbow and the additional junction/jog. A first feature is comprised of the line end section 314 and the first marker polygon (e.g., phase separation polygon) 317A. An example of how the first marker polygon (e.g., phase separation polygon) 317A is formed/defined is described below.

1. By using software program to search for any area (or called phase edge) which has about 0 nm external separation between both the 0 deg phase to the 180 deg phase layers.
2. Having detected and selected the edge, a polygon shape with the same phase edge and a width of a certain value (limited by the mask making capability as well as the targeted printed CD) can be created.
3. The generated (phase separation polygon) polygon is then used to substrate away from the both the 0 deg and 180 deg phase layers, resulting in a phase separation (Chrome region on phase mask). This feature will resemble that of a 90 deg line design elbow. FIG. 3B
4. As any corner may result in corner rounding, hence the later curving line end. The 90 deg line design elbow needs to be moved away from the straight line end. The 90 deg line design elbow is moved outward and away from the line end such that a corner rounding of greater radius is formed. As such, a jog (additional junction) on the line is created to maintain the original line straightness.
5. The distance depends on the pattern density. For isolated line feature, if such technique is used, the movement is not bonded as long as the resulted intensity due to the movement does not have any impact on its neighboring feature. The recommendation distance is at least and preferably more than the minimum design spacing with reference to the edge of the line end.

For much denser feature, as there is a space constraint on the movement, the recommendation distance is at least and preferably more than the 0.5*(minimum design spacing) with reference to the edge of the line end. Also, the addition junction should also be added preferably at least more than 0.5* (minimum design spacing) with reference to the edge of the line end.

C. Second Polygon Marker Formed Enlarging the First Marker Polygon by a Dimension D1

Figure 3C:
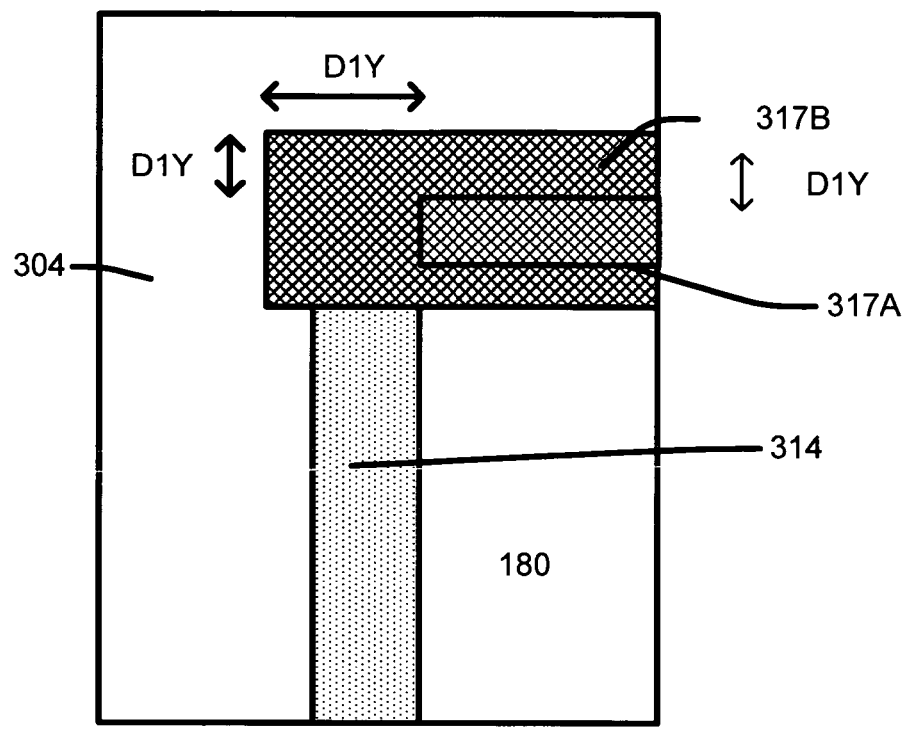

Referring to FIG. 3C, we enlarge the first marker polygon 317A by a dimension D1 (D1=(D1X in x direction) and (D1Y in y direction)) (that is dependent on the neighboring features) to form a second marker polygon 317B.

We enlarge the first marker polygon 317A preferably by a dimension D1 by a dimension D1 (dependent on the neighboring feature). In this illustration, the sized up region is subtracted from the 0 deg layer.

D1X and D1Y are dependent on the illuminating condition and can be obtained through simulation. As a guide line, D1X should be greater than the minimum line CD of the feature and less than the minimum pitch. It is about 1.5 times the CD.

D1Y is preferably less than the minimum space CD and greater or equal to 0.5 times the minimum line CD.

D. Adding the First Marker Polygon to the First Feature

Figure 3D:
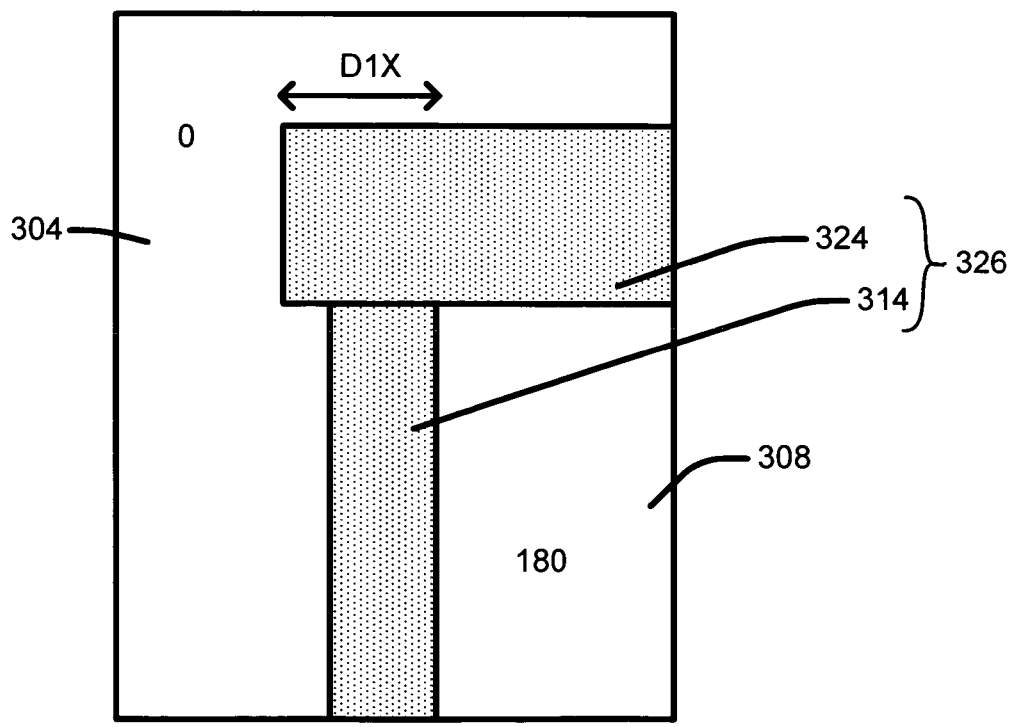

Referring to FIG. 3D, we add the second marker polygon 317B to the first feature 314 (e.g., chrome). We define the line end section 314 and the second marker polygon 317B as an opaque region.

E. Define a Third Marker Polygon

Figure 3E:
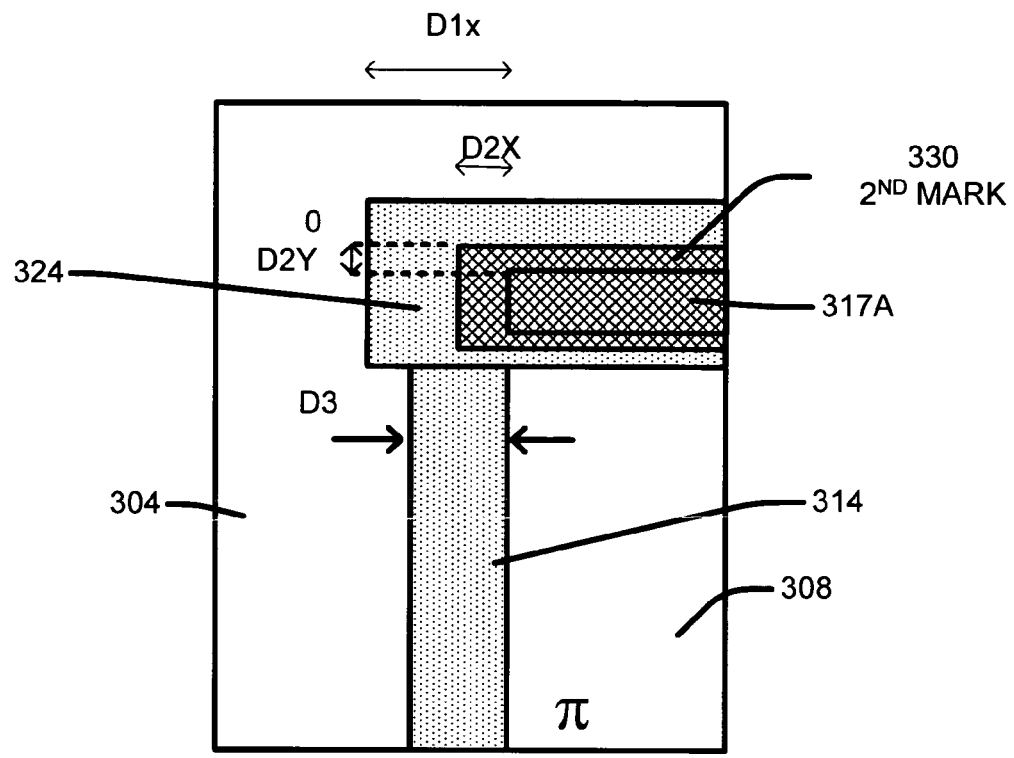

Referring to FIG. 3E, we define a third marker polygon 330 by enlarging the first marker polygon 317 by preferably a D2X dimension and D2Y dimension.

The marker 317A is sized up again by a dimension D2 such that D2=D1−D3, where D3 is the minimum width of design line.

Similar to D1X and D1Y, D2X and D2Y are dependent on the illuminating condition. As a guide, preferably D1Y−D2Y=minimum line CD, D1X−D2X=minimum line CD. D2X is about 0.5* minimum line CD.

F. The Third Marker Polygon is Defined as the Same Phase as the Second Shifter Region Referring to FIG. 3F, the third marker polygon 330A is defined as the same phase as the second shifter region 308. In this example, the third marker polygon region 330A is added to second phase layer 308.

G. Gap Region and a Jog

Figure 3F:
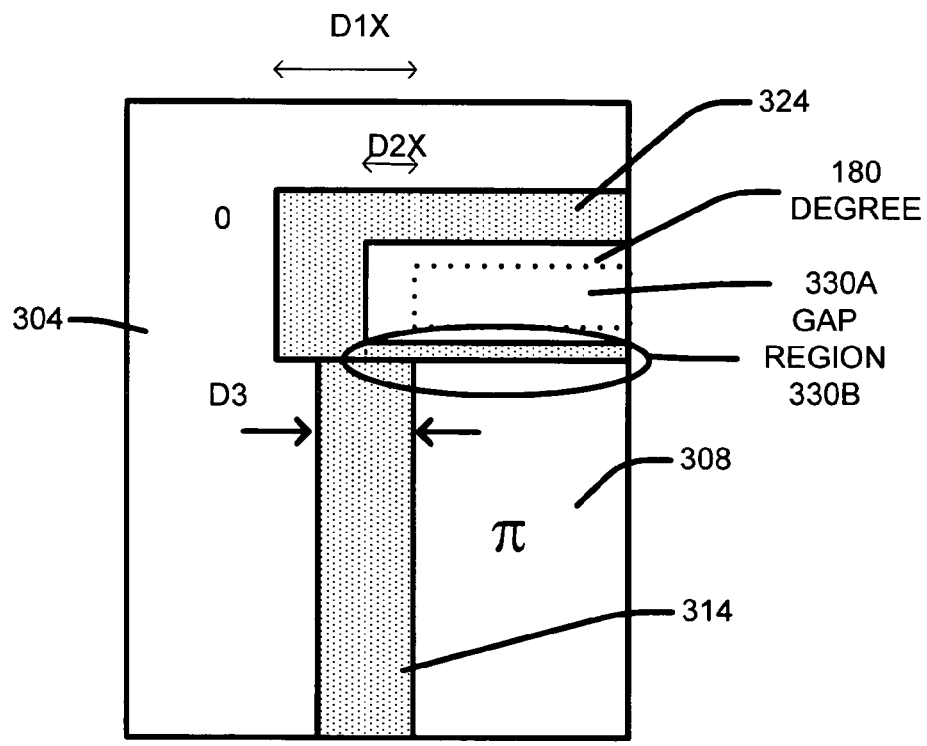
Figure 3G:
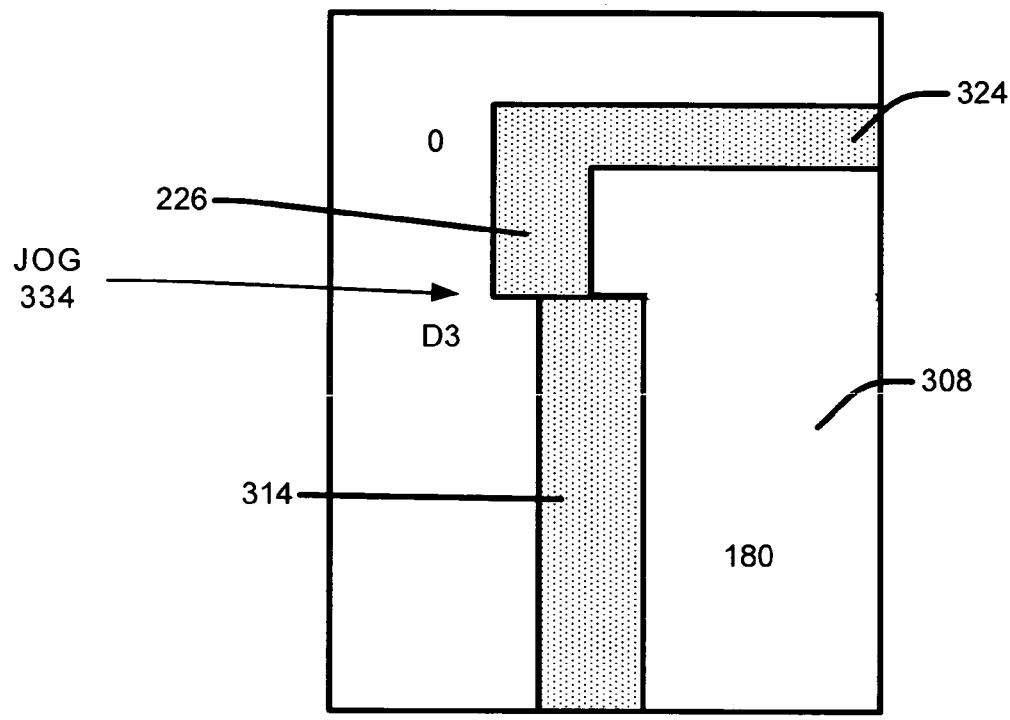

Referring to FIG. 3G, the gap region (or fourth marker polygon) 330B (if present) of the first feature 314 317B between the second marker polygon 330A and the second shifter region 308 is changed to the same phase as the second shifter region 308, thus creating a jog 334. If the third marker polygon 330A is adjacent to the second shifter region 308, there is no gap and no need to fill the gap. If there is a gap, the fourth marker polygon 330B is defined and filled as shown in FIGS. 3F and 3G.

FIG. 3G, shows the gap 330B in the 180 phase layer is identify and filled up.

H. Trim Mask

Figure 3H:
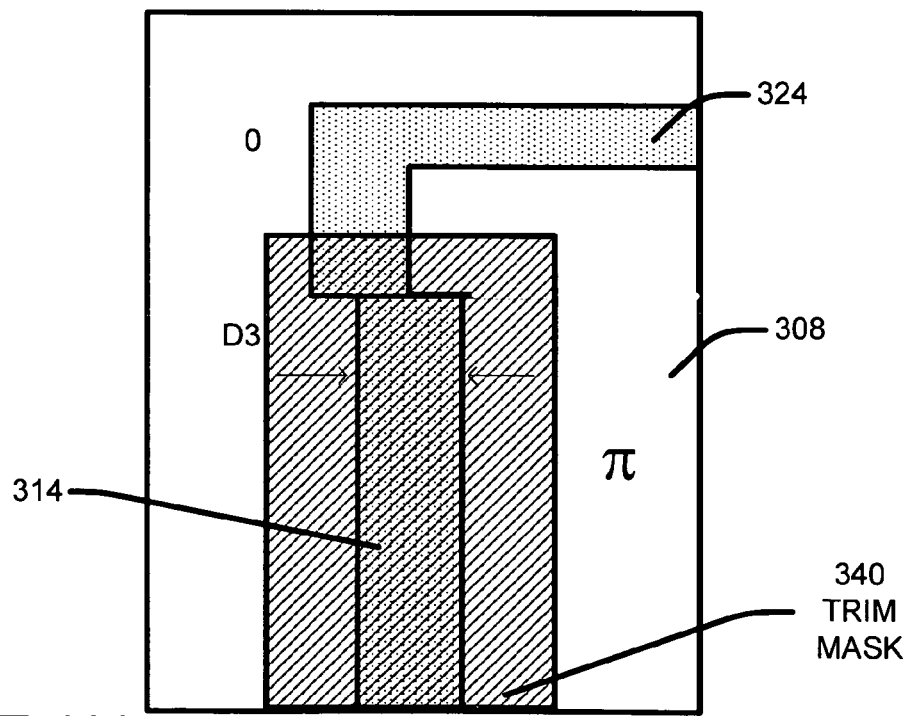

FIG. 3H shows a trim mask 340 design or a top view of the mask that overlays portions of the first feature. Trim mask 340 preferably is designed overlay to protect the phase-shifted line and remove the artifacts.

I. Resultant Resist Profile

Figure 3I:
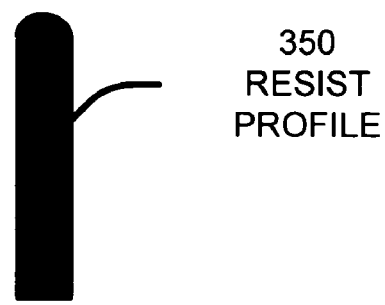

FIG. 3I shows a top down view of the resultant (e.g., positive) resist profile 350 that does not have the end line curving or shortening problem.

Figure 4A:
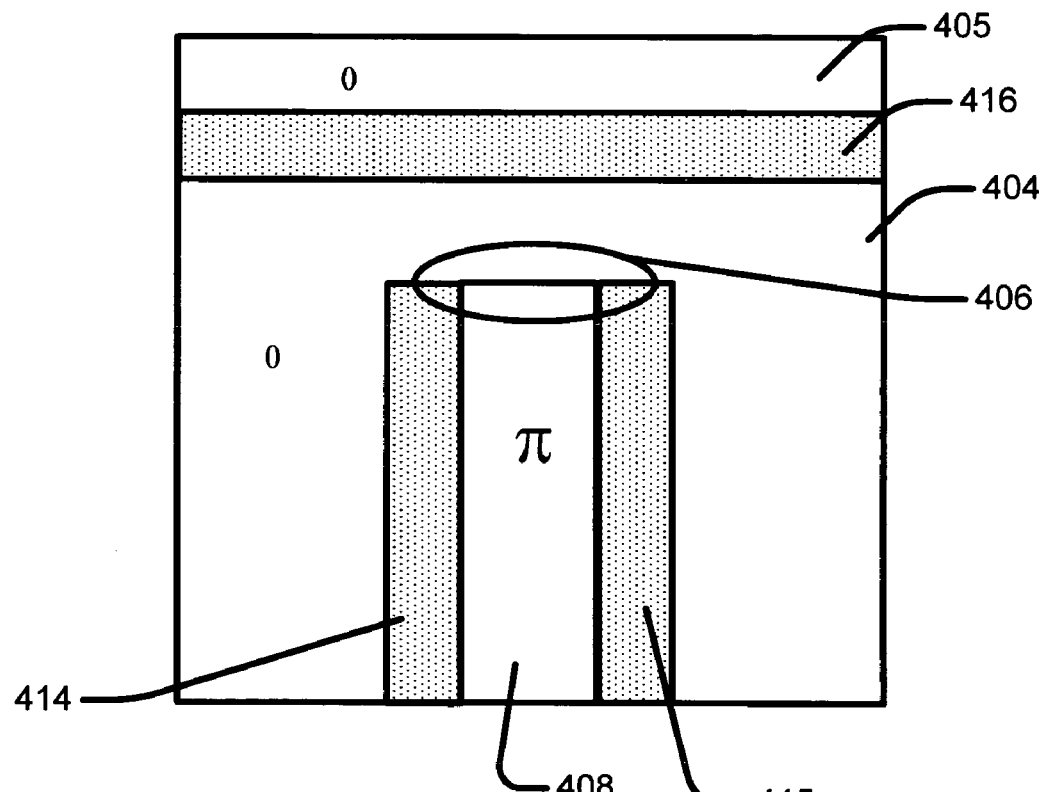
FIGS. 4A through 4I are top down views for illustrating a method for forming a phase shift mask layout according to an example embodiment of the present invention.
Figure 4B:
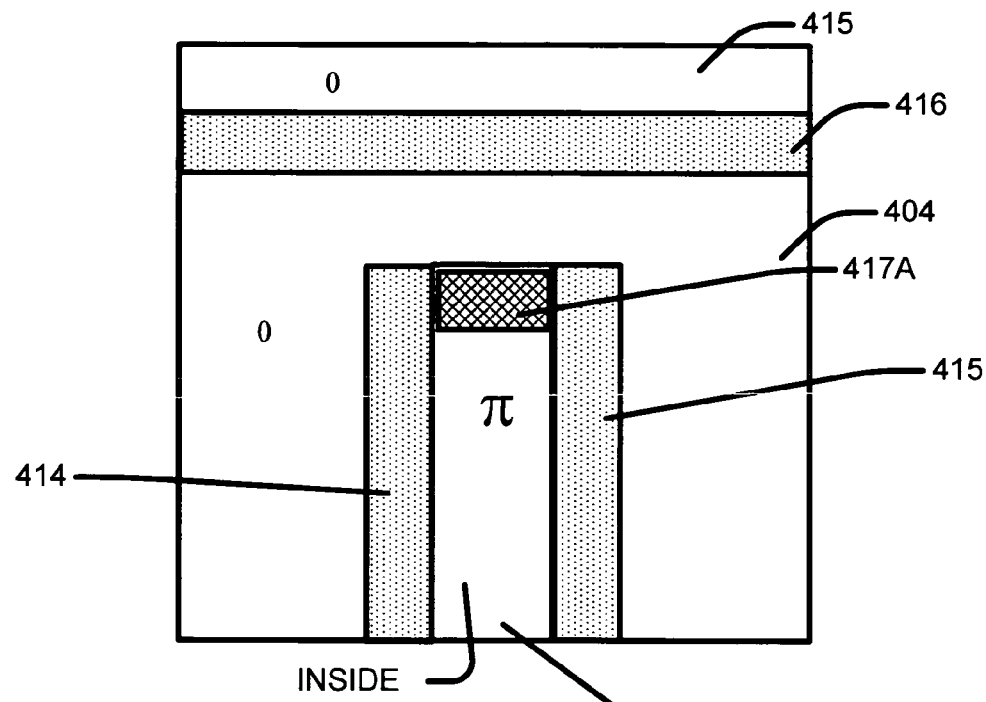
Figure 4C:
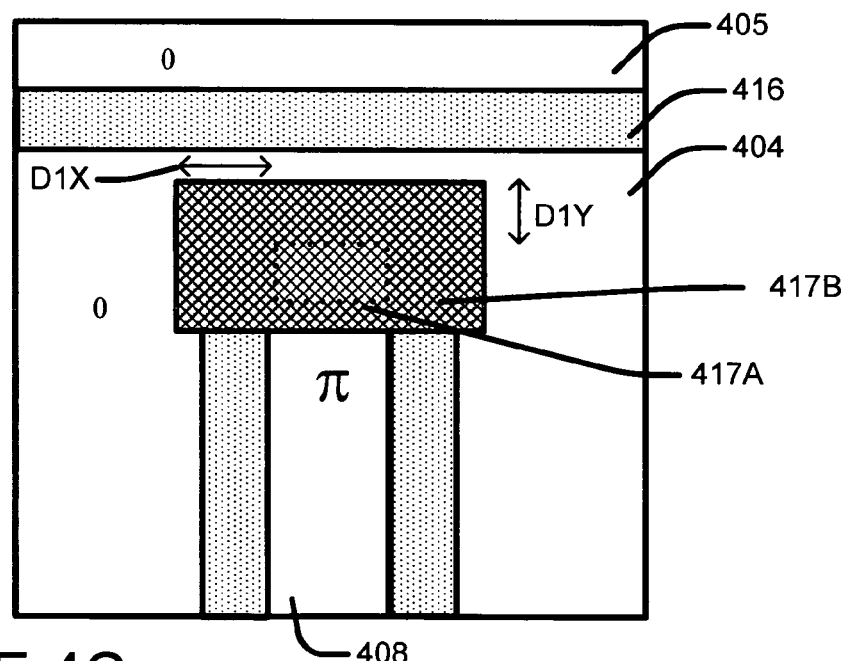
Figure 4D:
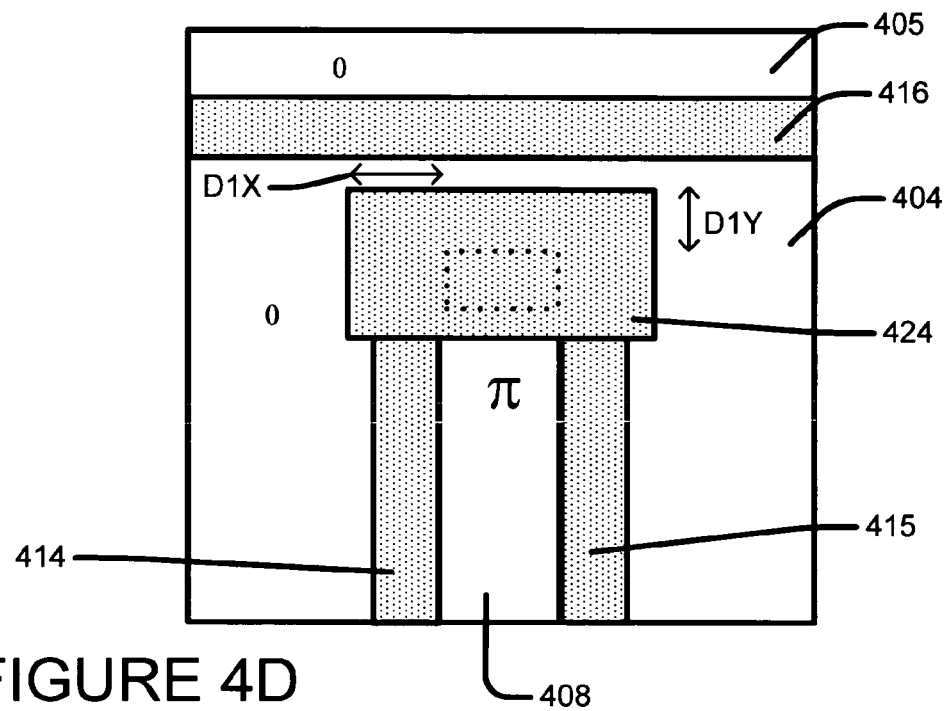
Figure 4E:
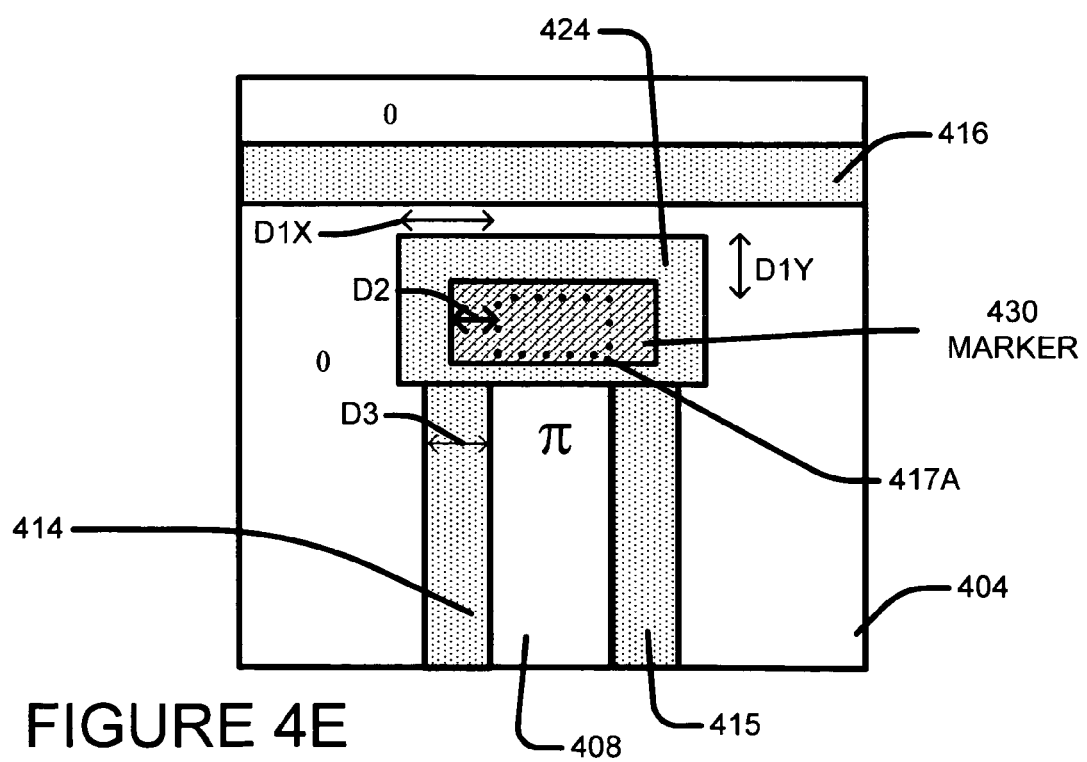
Figure 4F:
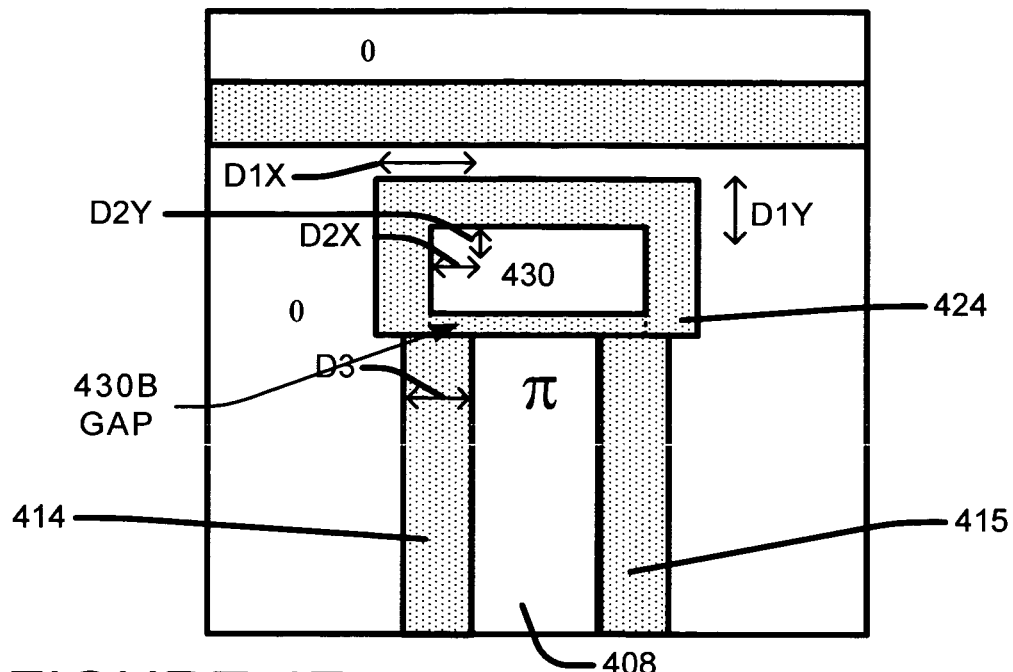
Figure 4G:
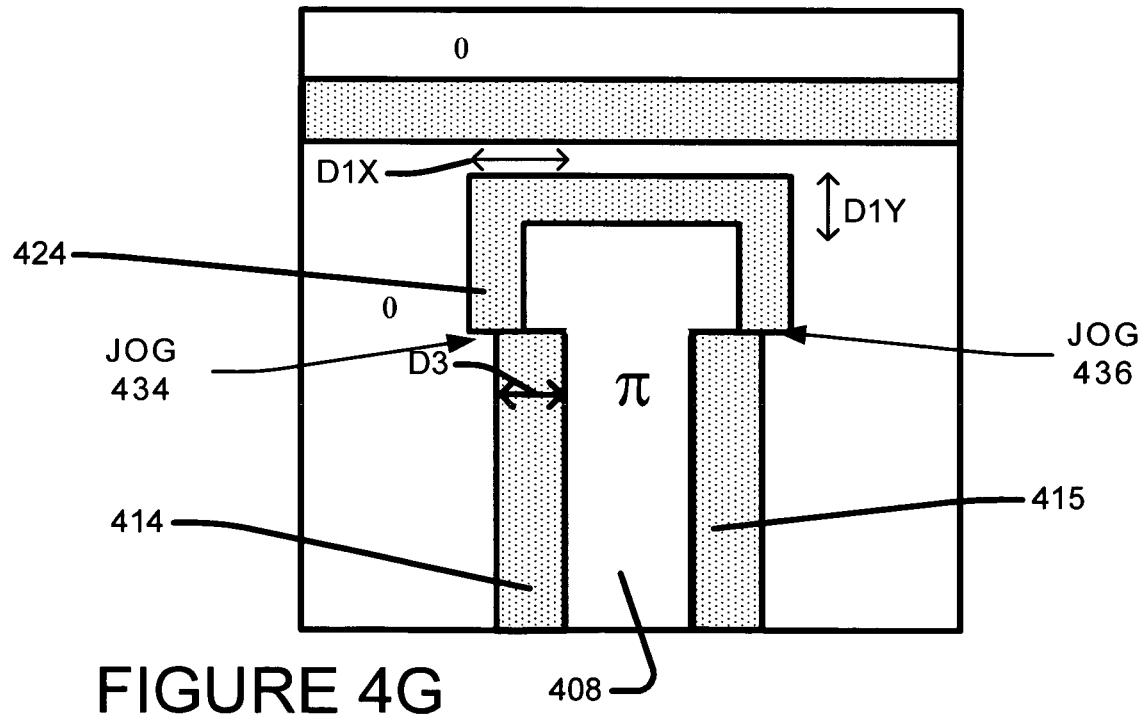
Figure 4H:
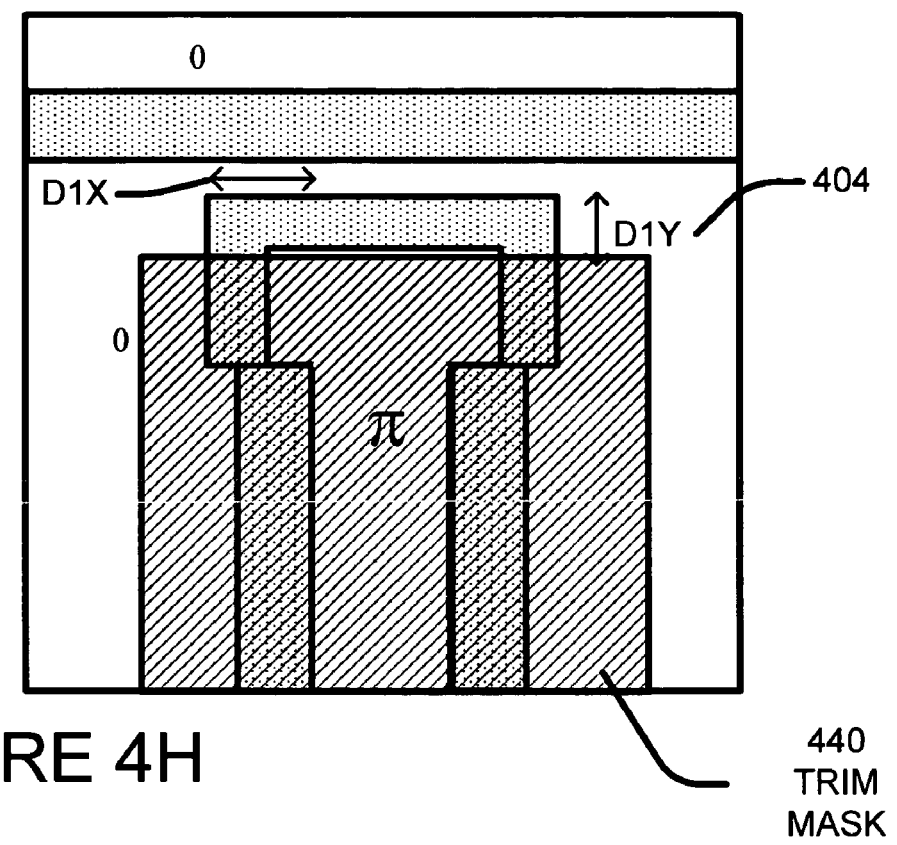
Figure 4I:
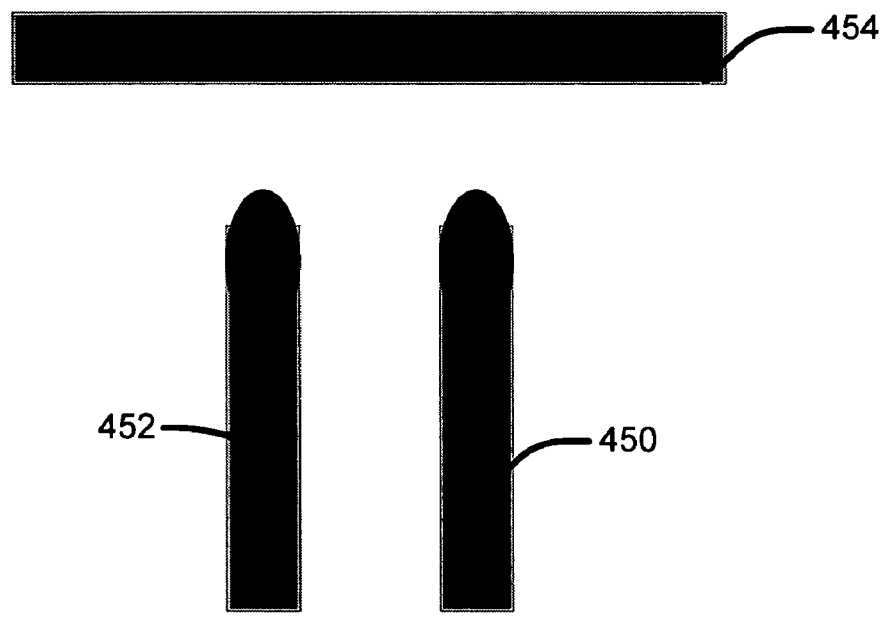

This method can be implemented in many structures such as a double line end design as shown in FIGS. 4A to 4I and discussed in more detail below. In FIG. 4I, the first 452 and second 450 features are double line ends proximate to the third feature 454.

Embodiment for a Double Line End

FIGS. 4A to 4I show an example embodiment for a PSM for a double line end configuration.

FIG. 4A shows a first and second feature 414 and 415 and a third line/feature 416, 180 shift region 408 and 0 shift regions 404 405; and phase conflict region 406.

The phase edge 406 is identified.

As shown in FIG. 4B, a first polygon marker 417A is generated using the phase edge as one of its sides.

As shown in FIG. 4C. by sizing up the first marker 417A by a dimension D1 (dependent on the neighboring feature) we form a second marker 417B.

As shown in FIG. 4D, in this illustration, the sized up second marker region 417B is defined as opaque and subtracted from the first (e.g., 0 degree) shifter layer 404.

As shown in FIG. 4E, the marker 417A is sized up again to form a third marker polygon 430. The marker 417A is preferably sized up by a dimension D2 (in both x and y directions D2X D2Y) such that D2=D1−D3, where D3 is the minimum width of design line.

Referring to FIG. 4F, the region 430 is added to 180 deg phase layer to form a second 180 shifter region 430.

As shown in FIG. 4G, the gap region 430B between the 180 phase layer 408 430 and is identified and filled up.

Two Jogs 434 and 436 are formed as shown in FIG. 4G. The feature 424 preferably maintains the minimum width D3 to minimize the phase interferences.

FIG. 4H shows a trim mask 440 layout added. The trim mask is used to protect the phase-shifted line and exposure any artifacts.

FIG. 4I shows the resultant positive resist profile of the two line ends 452 and 450 and third line portion 454.

Another embodiment is a phase shift mask having a layout having phase areas and opaque regions for defining at least a portion of an integrated circuit layout; the phase areas and opaque regions beginning defined using the following process described above.

Another Example of Double Line End

FIGS. 5A thru 5D illustrate another example of the embodiment's method for reducing line end shortening.

Figure 5A:
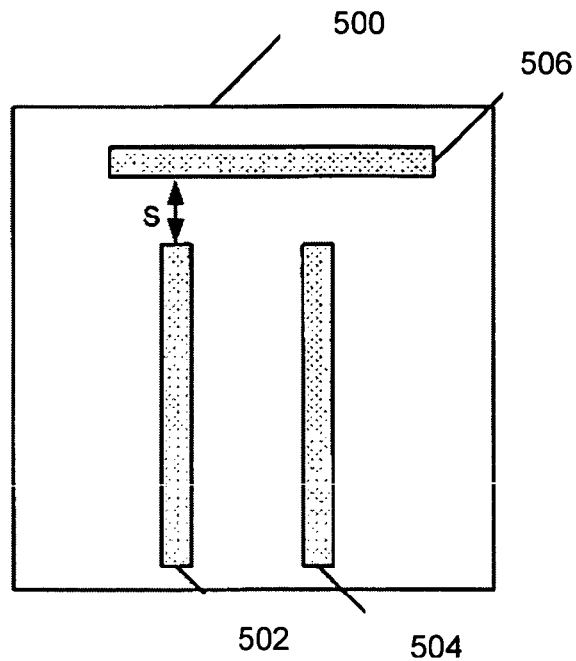
FIGS. 5A through 5E are top down views for illustrating a method for forming a phase shift mask layout according to an example embodiment of the present invention.

Turning to FIG. 5A, a portion of a layout 500 for an IC is shown. The layout 500 includes three features, the feature 502, the feature 504 and the feature 506. The spacing between the top edge of the feature 506 (and the bottom edge of the feature 502 is spacing S.

Figure 5B:
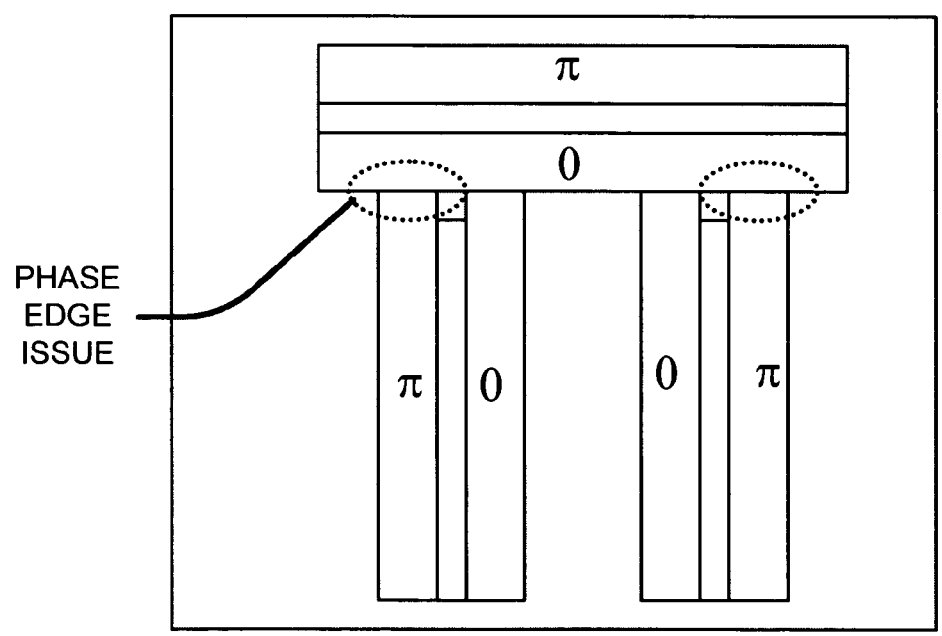

Turning to FIG. 5B, a proposed dark field phase shifting layout that uses chromeless phase transitions is shown (dark field of background not shaded for clarity). FIG. 5B shows a layout that has 0 and 180 (pi) degree phase shifters. The phase shifters are light transmissive regions designed to have the light shone through exit at a predetermined phase, e.g. 0 and 180 (e.g., pi). The other elements of FIG. 5B are shown to assist in comprehension of the phase shifting layout. In some embodiments, the bar composed of the mask substrate, a protective material such as chrome, of a narrower width than the features will separate the phase shifters (not shown). Note that in some embodiments the phase shifting layout will be fabricated as a dark field mask therefore there will be protective material by "default" between the phase shifters unless the phase shifters directly abut one another. Lastly, two phase conflict areas are highlighted with dash-line ovals, phase edge issue regions.

Figure 5C:
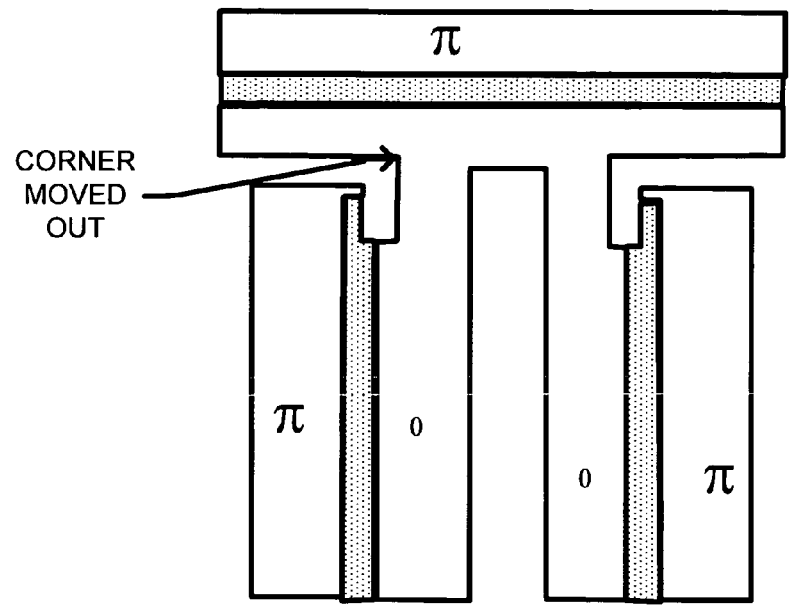

FIG. 5C shows an example PSM layout where several steps have been performed. A separating region(s) has been added to from a "L shaped" portion. The separating region(s) is added to separate the 0 and 180 degree phase regions. Also, the corner of the "L shaped" portion is moved outward away from the phase conflict region and the 180 degree region. A JOG has been added to the L-shaped portion.

Figure 5D:
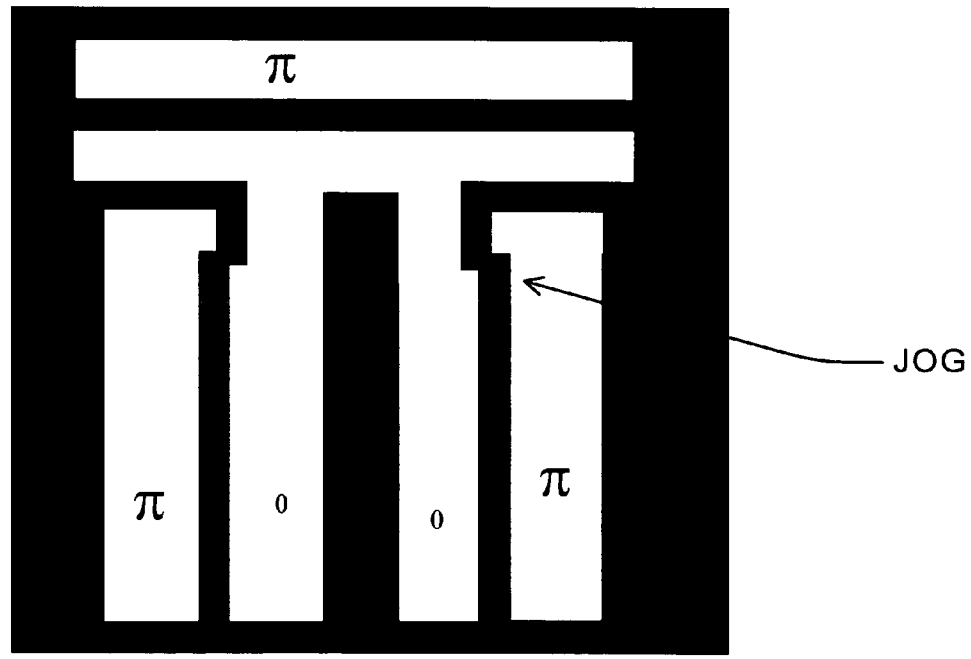

FIG. 5D shows a top down view of the layout/mask with the feature and field areas illustrated as opaque.

Figure 5E:
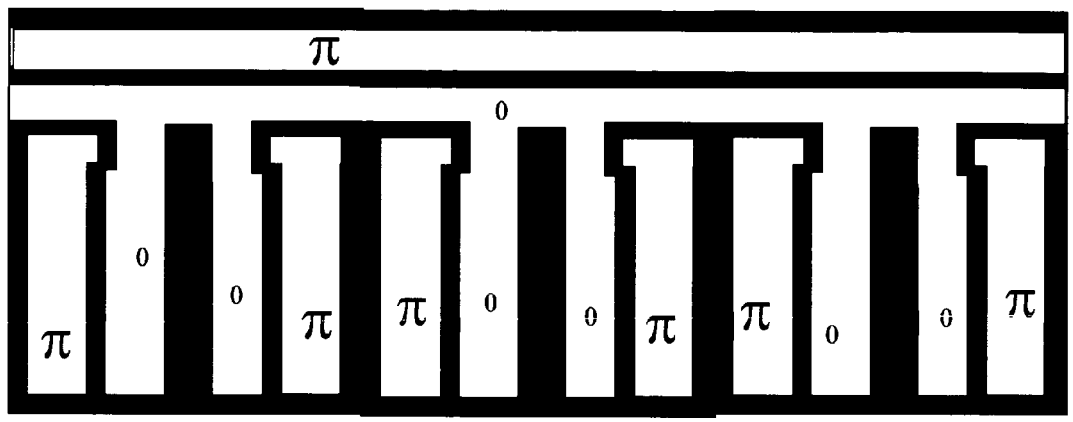

FIG. 5E shows a top down view of the layout/mask with the multiple line ends. The features and field areas illustrated as opaque areas.

A. Other Embodiments and Modifications

The invention is not limited to the exact features shown in the figures. Variations can be made as known to those skilled in the art. For example the shifter regions 0 and 180 can be switched. Light and dark field mask can be designed.

B. Double or More JOGS

Figure 6:
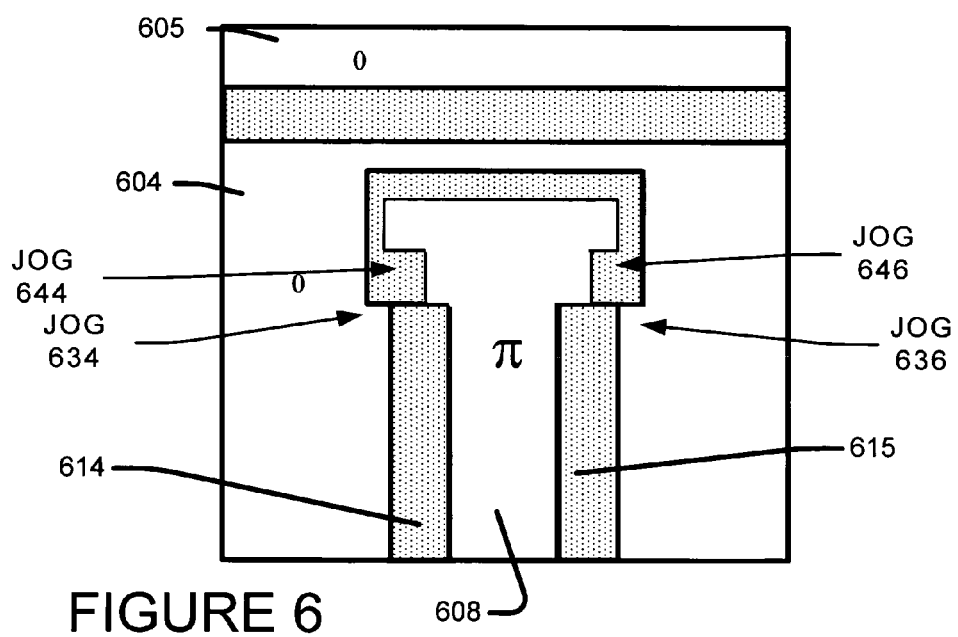
FIG. 6 shows an embodiment of a double job implemented on a double line end.

Another embodiment is using two or more jogs. FIG. 6 shows an embodiment of a double job implemented on a double line end. (Compare with FIG. 4G). FIG. 6 shows first set of jogs 634 636 and second set of jogs 644 and 646. The jogs and mask are formed as described above. FIG. 6 shows first and second feature 614 and 615 and 180 shift region 608, and 0 degree shift regions 605 604. FIG. 6 can represent the layout or the actual mask formed by the layout.

Computer Implementation Embodiment

Figure 7:
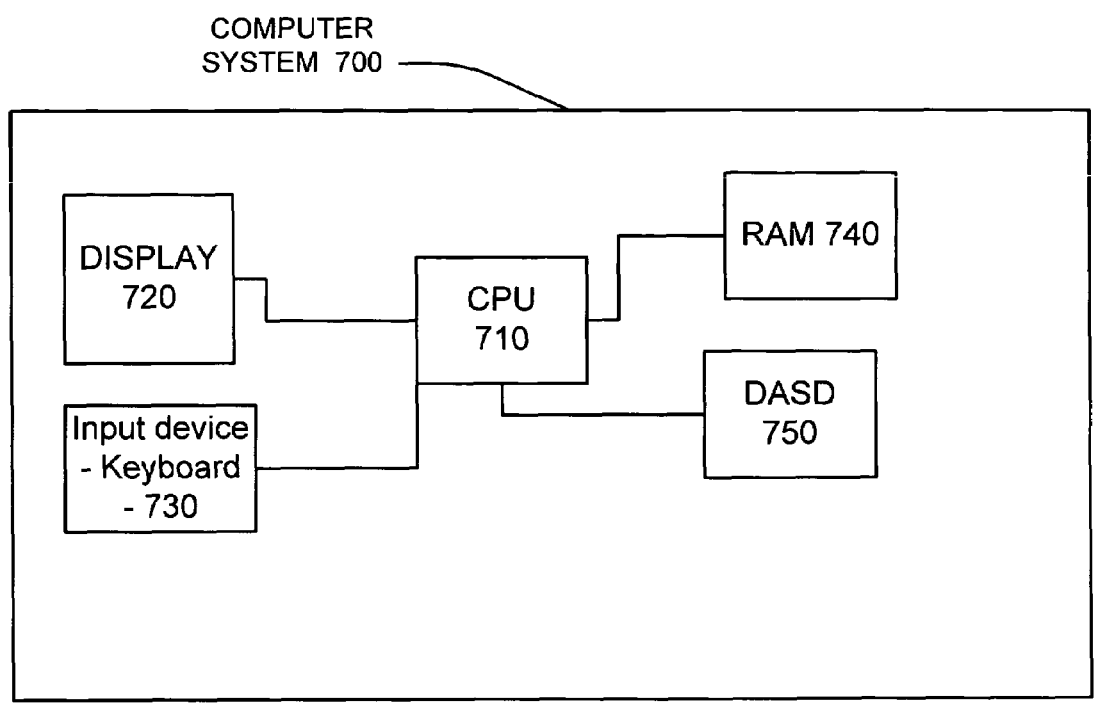
FIG. 7 shows a diagram of a non-limiting example embodiment of a computer that can be used in an embodiment of the invention.

FIG. 7 shows a diagram of a non-limiting example embodiment of a computer that can be used in an embodiment of the invention. Referring to FIG. 7, the computer system 700 shown comprises a CPU (Central Processing Unit) 710, a terminal with a monitor 720 connected to the CPU 710 for receiving data from the CPU 710 and a input device (e.g., keyboard) 730 connected to the CPU 710 for sending data respectively to the CPU 710. A RAM (Random Access Memory) 740 and a DASD 750 associated with the CPU are shown connected for bidirectional communication of data to and from CPU. The mask layout application can run on the computer system or more than one computer system or network.

An embodiment of the invention is a computer program for producing a layout for a phase shift mask as described for all embodiments and options. In an example the program comprises the following.

a first set of computer instructions for providing a layout comprising a first feature, a first shifter region and a second shifter region; said first feature has a elbow region a second set of computer instructions for identifying a phase conflict region caused by the first feature, the first shifter region and the second shifter region; and a third set of computer instructions for resolving the phase conflict region by modifying the elbow region by moving the elbow region away from the first shifter region and the phase conflict region thereby creating a layout for a phase shift mask.

In another embodiment the first set of instructions further includes instructions for providing a first layout comprised of a line end section, a first shifter region and a second shifter region; said first and said second shifter regions meet at phase edge at about a right angle to the length of said line end section;

adding a phase separation region to said line end section to form a first feature; said phase separation region separates said first shifter region and said second shifter region;

said first feature has an elbow region; said first shifter region is on the outside of first feature and said second shifter region is on the inside of said first feature;

said elbow region having an outside corner away from the second shifter region.

Another embodiment is the media the contains the computer program(s).

A. Non-Limiting Embodiments

In the above description numerous specific details are set forth in order to provide a more thorough understanding of the present invention. It will be obvious, however, to one skilled in the art that the present invention may be practiced without these details. In other instances, well known process have not been described in detail in order to not unnecessarily obscure the present invention.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method for forming a layout for a phase shift mask, the method comprising:

providing a layout comprising a first feature, a first shifter region and a second shifter region; said first feature has an elbow region;

identifying a phase conflict region caused by the first feature, the first shifter region and the second shifter region; and resolving the phase conflict region by modifying the elbow region by moving the elbow region away from the first shifter region and the phase conflict region thereby creating a layout for a phase shift mask.

2. The method of claim 1 which further includes forming said first feature by adding a phase separation region to a line end section; said phase separation region formed to further separate the first and second shifter regions to reduce phase conflict.

3. The method of claim 1 which further includes forming said first feature by:

providing a first layout comprised of a line end section, a first shifter region and a second shifter region; said first and said second shifter regions meet at phase edge at about a right angle to the length of said line end section; and adding a phase separation region to said line end section to form a first feature; said phase separation region separates said first shifter region and said second shifter region; said first feature has an elbow region; said first shifter region is on the outside of first feature and said second shifter region is on the inside of said first feature; said elbow region having an outside corner away from the second shifter region.

4. The method of claim 1 wherein the modification of the elbow region further comprises forming a jog region in said first feature or in said phase separator region.

5. The method of claim 1 wherein said first feature is comprised of a line end section and a phase separation region.

6. The method of claim 1 which further includes said first feature has a minimum width that minimizes phase conflicts.

7. The method of claim 1 wherein the layout is for a dark field mask and said first feature is opaque.

8. The method of claim 1 which further includes fabricating a phase shift mask using the layout for the phase shift mask.

9. The method of claim 1 which further includes designing a layout for a trim mask to remove any artifact created by the layout.

10. A method for forming a layout for a phase shift mask, the method comprising:

a) providing a layout comprised of a line end section, a first shifter region and a second shifter region; said first and said second shifter regions meet at phase edge at about a right angle to the length of said line end section;

b) adding a phase separation region to said line end section to form a first feature; said phase separation region separates said first shifter region and said second shifter region;

(1) said first feature has an elbow region; said first shifter region is on the outside of first feature and said second shifter region is on the inside of said first feature;

(2) said elbow region having an outside corner away from the second shifter region;

c) identifying a phase conflict region caused by the first feature, the first shifter region and the second shifter region; and d) resolving the phase conflict region by modifying the elbow region by moving the elbow region away from the first shifter region and the phase conflict region thereby creating a layout for a phase shift mask.

11. The method of claim 10 wherein the modification of the elbow region further comprises forming a jog region in said first feature or in said phase separator region.

12. The method of claim 10 which further includes positioning said phase separation region positioned to further separate the first and second shifter regions to reduce phase conflict.

13. The method of claim 10 which further includes said first feature has a minimum width that minimizes phase conflicts.

14. The method of claim 10 wherein the layout is for a dark field mask and said first feature is opaque.

15. The method of claim 10 which further includes fabricating a phase shift mask using the layout for the phase shift mask.

16. A method for forming a layout for a phase shift mask, the method comprising:

providing a layout comprised of a line end section, a first shifter region and a second shifter region; said line end section defined opaque;

identifying a phase conflict region caused by said line end section, the first shifter region and the second shifter region;

generating a first marker polygon that separates said first shifter region and said second shifter region in said phase conflict region;

said line end section and said first marker polygon have an elbow region; said first shifter region is on the outside of elbow region; said second shifter region is on the inside of said elbow region;

defining a second marker polygon by enlarging the first marker polygon;

adding the second marker polygon to the line end section to form a first feature; and defining the first marker polygon as opaque;

defining a third marker polygon by enlarging the first marker polygon;

the third marker polygon is defined as the same phase as the second shifter region; and defining a fourth maker polygon to cover any gap region of the first feature that is between the second marker polygon and the second shifter region to the same phase as the second shifter region; defining the fourth marker polygon the same phase as the second shifter region.

17. The method of claim 16 which further comprises a second feature and a third feature; said first and second features are double line end sections proximate to said third feature.

18. The method of claim 16 which further comprises:

providing a layout comprised of a line end section, a first shifter region and a second shifter region; said first and said second shifter regions meet at phase edge at about a right angle to the length of said line end section; and adding a first marker polygon to said line end section to form a first feature; a first marker polygon overlaying said phase edge;

said first feature having an L-shape portion with an elbow region; said first shifter region is on the outside of said L-shaped portion and said second shifter region is on the inside of said L-shaped portion; thereby creating a layout for a phase shift mask.

19. The method of claim 16 which further includes fabricating a phase shift mask using the layout for the phase shift mask.

20. The method of claim 16 which further includes designing a layout for a trim mask to remove any artifact created by the layout.

21. A phase shift mask having a layout having phase areas and opaque regions for defining at least a portion of an integrated circuit layout, the phase areas and opaque regions being defined using the following process comprising:

providing a layout comprising a first feature, a first shifter region and a second shifter region; said first feature has an elbow region;

identifying a phase conflict region caused by the first feature, the first shifter region and the second shifter region; and resolving the phase conflict region by modifying the elbow region by moving the elbow region away from the first shifter region and the phase conflict region thereby creating a layout for a phase shift mask.

22. The phase shift mask of claim 21 which further includes forming said first feature by adding a phase separation region to a line end section; said phase separation region formed to further separate the first and second shifter regions to reduce phase conflict.

23. The phase shift mask of claim 21 which further comprises:

forming said first feature by providing a first layout comprised of a line end section, a first shifter region and a second shifter region; said first and said second shifter regions meet at phase edge at about a right angle to the length of said line end section;

adding a phase separation region to said line end section to form a first feature; said phase separation region separates said fist shifter region and said second shifter region;

said first feature has an elbow region;

said first shifter region is on the outside of first feature and said second shifter region is on the inside of said first feature; and said elbow region having an outside corner away from the second shifter region.

24. The phase shift mask of claim 21 wherein the modification of the elbow region further comprises forming a jog region in said first feature or in said phase separator region.

25. The phase shift mask of claim 21 wherein said first feature is comprised of a line end section and a phase separation region; and the modification of the elbow region further comprises forming a jog region in said first feature or in said phase separator region.

26. The phase shift mask of claim 21 which further includes said first feature has a minimum width that minimizes phase conflicts.

27. The phase shift mask of claim 21 wherein the layout is for a dark field mask and said first feature will be an opaque.

28. The phase shift mask of claim 21 further includes fabricating a phase shift mask using the layout for the phase shift mask.

29. A method for forming a semiconductor device comprising:

providing a phase shift mask with a layout having a first feature having an elbow region, a first shifter region, and a second shifter region, a phase conflict region resolved by moving the elbow region away from the first shifter and phase conflict regions; and patterning a substrate with the phase shift mask.

30. The method of claim 29 wherein patterning the substrate comprises exposing a photoresist layer on the substrate using the phase shift mask.

31. The method of claim 30 wherein:

the phase shift mask the first feature comprises a phase separation region added to a line end section; and phase conflict is reduced by separating the first and second shifter regions with the phase separation region.

32. The method of claim 30 wherein the first feature or in a phase separation region of the phase shift mask includes a jog region.

33. The method of claim 30 wherein the first feature comprises a line end section and a phase separation region.

34. The method of claim 30 wherein the first feature comprises a minimum width that minimizes phase conflicts.

35. The method of claim 30 wherein the layout is for a dark field mask and the first feature is opaque.

* * * * *